United States Patent [19]

Matsugu et al.

[11] Patent Number: 5,196,711
[45] Date of Patent: Mar. 23, 1993

[54] DEVIATION MEASURING DEVICE INCLUDING A MASK HAVING A GRATING PATTERN AND A ZONE PLATE PATTERN

[75] Inventors: Masakazu Matsugu, Atsugi; Kenji Saitoh, Yokohama, both of Japan

[73] Assignee: Canon Kabushiki Kaisha, Tokyo, Japan

[21] Appl. No.: 643,475

[22] Filed: Jan. 22, 1991

[30] Foreign Application Priority Data

Jan. 23, 1990 [JP] Japan ................... 2-013263

[51] Int. Cl.$^5$ .............................. G01V 9/04
[52] U.S. Cl. ........................... 250/548; 356/400
[58] Field of Search ........... 250/548, 557, 561, 237 G; 356/363, 356, 399, 400, 401

[56] References Cited

U.S. PATENT DOCUMENTS

| | | | |
|---|---|---|---|
| 4,311,389 | 1/1982 | Fay et al. | 250/548 |
| 4,779,001 | 10/1988 | Makosch | 250/548 |
| 4,815,854 | 3/1989 | Tanaka et al. | 356/356 |
| 4,870,289 | 9/1989 | Sato et al. | 250/548 |
| 4,948,983 | 8/1990 | Maruyama et al. | 250/548 |
| 4,999,487 | 3/1991 | Maruyama et al. | 359/565 |
| 5,028,797 | 7/1991 | Abe et al. | 250/548 |

FOREIGN PATENT DOCUMENTS

| | | |
|---|---|---|
| 0329430 | 8/1989 | European Pat. Off. |
| 0329433 | 8/1989 | European Pat. Off. |
| 0332300 | 9/1989 | European Pat. Off. |
| 0333326 | 9/1989 | European Pat. Off. |
| 0336537 | 10/1989 | European Pat. Off. |
| 61-111402 | 5/1986 | Japan |
| WO85/04266 | 9/1985 | PCT Int'l Appl. |

*Primary Examiner*—David C. Nelms
*Assistant Examiner*—John R. Lee
*Attorney, Agent, or Firm*—Fitzpatrick, Cella, Harper & Scinto

[57] ABSTRACT

A device for detecting relative positional deviation between a mask and a wafer is disclosed, wherein the mask has a first grating pattern and a zone plate pattern and the wafer has a second grating pattern. The device includes a directing system for directing a radiation beam to the first grating pattern of the mask, such that the first grating pattern produces a first transmitted beam which is then inputted to the wafer substantially perpendicularly and a second transmitted beam which is obliquely inputted to the wafer and such that the first grating pattern also produces a first reflected beam; and a detecting system for detecting (i) the first reflected beam and also for detecting (ii) a second reflected beam resulting from reflective diffraction of the first transmitted beam by the second diffraction pattern of the wafer, the third reflected beam being displaceable with any inclination of a surface of the wafer and (iii) a third reflected beam resulting from reflection of the second transmitted beam by the wafer surface and from diffraction of the same by the zone plate pattern of the mask and being displaceable with any inclination of the wafer surface and an interval between the mask and the wafer.

29 Claims, 6 Drawing Sheets

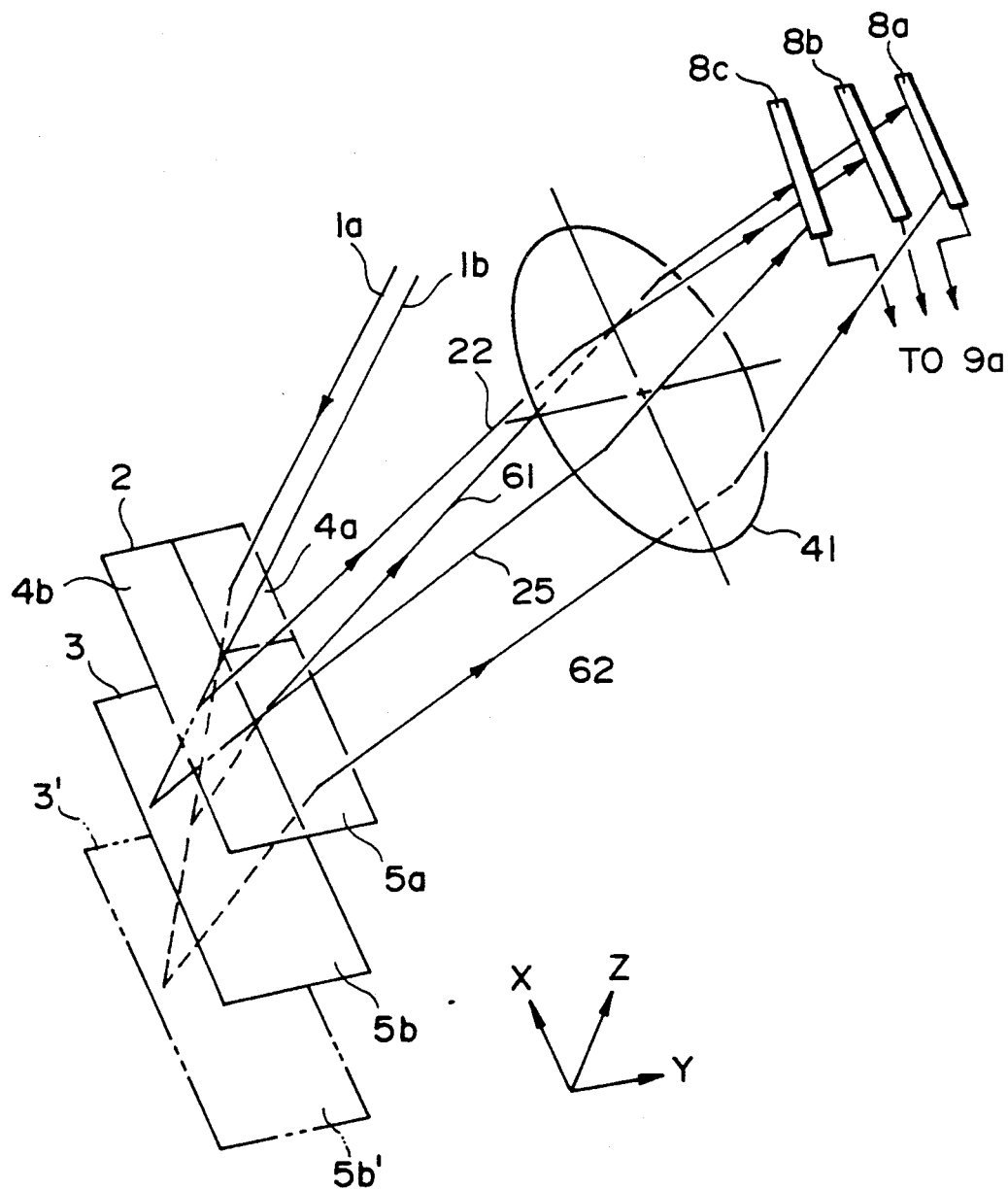
F I G. 1

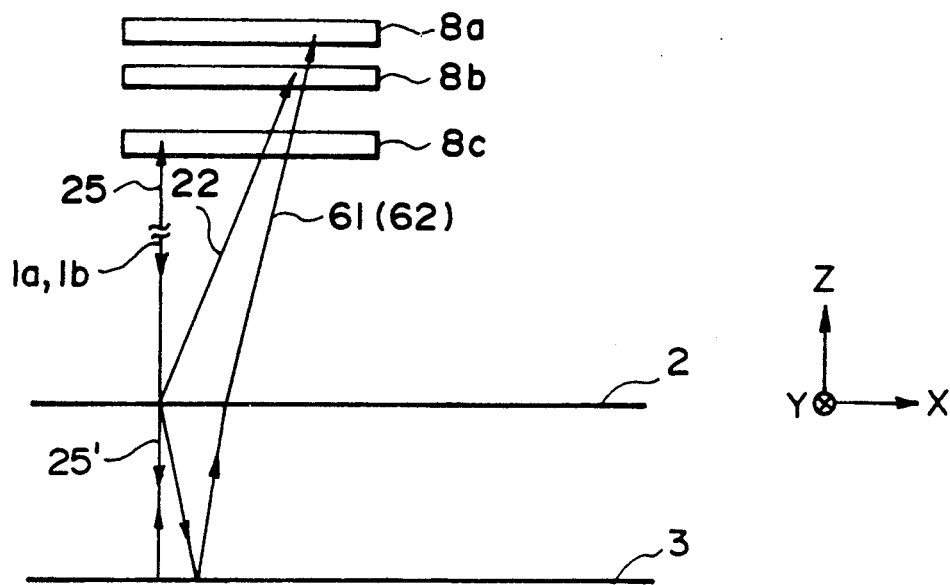
F I G. 6A
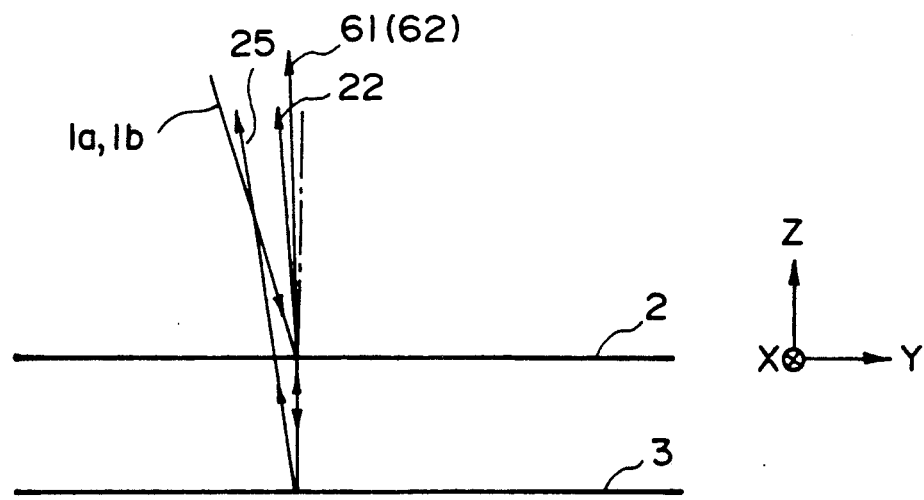
F I G. 6B

DEVIATION MEASURING DEVICE INCLUDING A MASK HAVING A GRATING PATTERN AND A ZONE PLATE PATTERN

FIELD OF THE INVENTION AND RELATED ART

This invention relates to a deviation measuring device for measuring the interval between two objects at high precision. As an example, the invention is suitably usable in a semiconductor device manufacturing apparatus, for controlling the interval between a mask and a wafer to a predetermined magnitude.

Conventionally, in semiconductor device manufacturing apparatuses, the interval between a mask and a wafer is measured by using an interval measuring device and, after the interval is controlled to a predetermined magnitude, a pattern of the mask is photolithographically transferred to the wafer.

FIG. 7 is a schematic representation of an interval measuring device as proposed in Japanese Laid-Open Patent Application No. Sho 61-111402. As illustrated, a mask (first object) M and a wafer (second object) W are disposed opposed to each other, and light is projected and focused by a lens L1 at a point PS between the mask M and the wafer W.

Here, the light is reflected by the surface of the mask M and the surface of the wafer W, sequentially, and beams of reflected light from the mask M and the wafer W are projected and focused by another lens L2 at points PW and PM on a screen S surface. The interval between the mask M and the wafer W can be measured by detecting the spacing between the spots PW and PM of focused light on the screen S surface.

In this structure, however, if, for example, the screen S surface tilts from its predetermined attitude, the spacing between the light spots PW and PM changes. This causes an error in a measured quantity. This is also with the case where the wafer tilts relative to the mask.

SUMMARY OF THE INVENTION

It is accordingly a primary object of the present invention to provide an improved deviation detecting device by which the interval between a mask and a wafer, for example, can be detected very accurately.

In accordance with a first aspect of the present invention, to achieve this object, there is provided a device for detecting relative positional deviation between a mask and a wafer, wherein the mask has a first grating pattern and a zone plate pattern and the wafer has a second grating pattern, said device comprising: directing means for directing a radiation beam to the first grating pattern of the mask, such that the first grating pattern produces a first transmitted beam which is then inputted to the wafer substantially perpendicularly and a second transmitted beam which is obliquely inputted to the wafer and such that the first grating pattern also produces a first reflected beam; and detecting means for detecting (i) the first reflected beam and also for detecting (ii) a second reflected beam resulting from reflective diffraction of the first transmitted beam by the second diffraction pattern of the wafer, the second reflected beam being displaceable with any inclination of a surface of the wafer and (iii) a third reflected beam resulting from reflection of the second transmitted beam by the wafer surface and from diffraction of the same by the zone plate pattern of the mask and being displaceable with any inclination of the wafer surface, and an interval between the mask, the third reflected beam the wafer.

Also, in accordance with a second aspect of the present invention, there is provided a device for detecting a relative positional deviation between a mask and a wafer, wherein the mask has first and second grating patterns and a zone plate pattern disposed with a predetermined orientation together with the second grating pattern, wherein the wafer has a third grating pattern, and wherein each of the first to third grating patterns is provided by grating elements of regular intervals, said device comprising: directing means for directing a radiation beam to the first and second grating patterns of the mask so that it is obliquely inputted to the mask with respect to a plane substantially orthogonal to a predetermined direction, such that the first grating pattern produces a first transmissively diffracted beam which is then inputted to the wafer substantially perpendicularly and also produces a first reflected beam while the second grating pattern produces a second transmissively diffracted beam which is then obliquely inputted to the wafer; and photodetecting means having a light receiving surface, for detecting (i) a position of incidence of the first reflected beam upon said light receiving surface, (ii) a position of incidence upon said light receiving surface of a second reflected beam resulting from reflective diffraction of the first transmissively diffracted beam, by the third grating pattern of the wafer, the second reflected beam being displaceable in said predetermined direction with any inclination of a surface of the wafer, and (iii) a position of incidence upon said light receiving surface of a third reflected beam resulting from reflection of the second transmissively diffracted beam by the wafer surface and from diffraction of the same by the zone plate pattern of the mask, the third reflected beam being displaceable in said predetermined direction with any inclination of the wafer surface and with an interval between the mask and the wafer.

Further, in accordance with a third aspect of the present invention, there is provided a device for detecting a relative positional deviation between a mask and a wafer, said device comprising: directing means for directing a radiation beam to the mask, such that the mask produces a first transmitted beam which is then inputted to the wafer substantially perpendicularly and a second transmitted beam which is then obliquely inputted to the wafer and that the mask also produces a first reflected beam; and detecting means for detecting (i) the first reflected beam and also for detecting (ii) a second reflected beam resulting from reflection of the first transmitted beam by the wafer and (iii) a third reflected beam resulting from reflection of the second transmitted beam by the wafer, the third reflected beam from diffraction of the same by a zone plate of the mask and being displaceable with any inclination of the wafer and with an interval between the mask and the wafer.

In one preferred form, the detecting means comprises photoelectric converting means for detecting positions of incidence of the first, second and third reflected beams thereupon.

The photoelectric converting means may comprise an array of first, second and third photodetectors for receiving the first, second and third reflected beams independently of each other. Alternatively, it may comprise a single photodetector such as, for example, an image pickup device having light receiving elements arrayed two-dimensionally. This photodetector may comprise arrayed light receiving elements, or a position sensitive detector may be used.

A single light collecting lens system may be used to direct the first, second and third reflected beams to the photoelectric converting means, or separate, first, second and third light collecting lens systems may be used to direct the first to third reflected beams to the photoelectric converting means independently of each other. However, the present invention is attainable without such a lens system or systems.

The directing means may comprise a light emitting diode (LED) or a semiconductor laser, which emits the radiation beam. Preferably, as the radiation beam, the directing means may direct a substantially parallel light beam to the first grating pattern.

Preferably, each grating pattern may be provided by grating elements of regular intervals, having substantially no power. In one preferred form, the photoelectric converting means is structured so as to be responsive to displacement of the first, second or third reflected beam in a predetermined direction, and the grating lines of each grating pattern extend obliquely to that direction.

The directing means and the detecting means or the photoelectric converting means may be mounted to an optical detection head which may be made movable along the surface of the mask.

On the basis of the position of incidence of the second reflected beam upon the photoelectric converting means, any inclination of the wafer surface with respect to a predetermined plane may be detected and then corrected while, on the other hand, the interval between the mask and the wafer may be determined on the basis of the position of incidence of the first reflected beam upon the photoelectric converting means and the position of incidence of the third reflected beam upon the photoelectric converting means.

The present invention is particularly suitably applicable to an exposure apparatus for manufacture of semiconductor devices. More particularly, the invention is suitably usable in a proximity type exposure apparatus wherein a mask and a wafer are placed close to each other.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a perspective view, schematically illustrating a major portion of a deviation measuring device according to an embodiment of the present invention.

FIGS. 6A-6D are schematic representations, respectively, showing optical paths in different portions.

DESCRIPTION OF THE PREFERRED EMBODIMENTS

Figure 2:
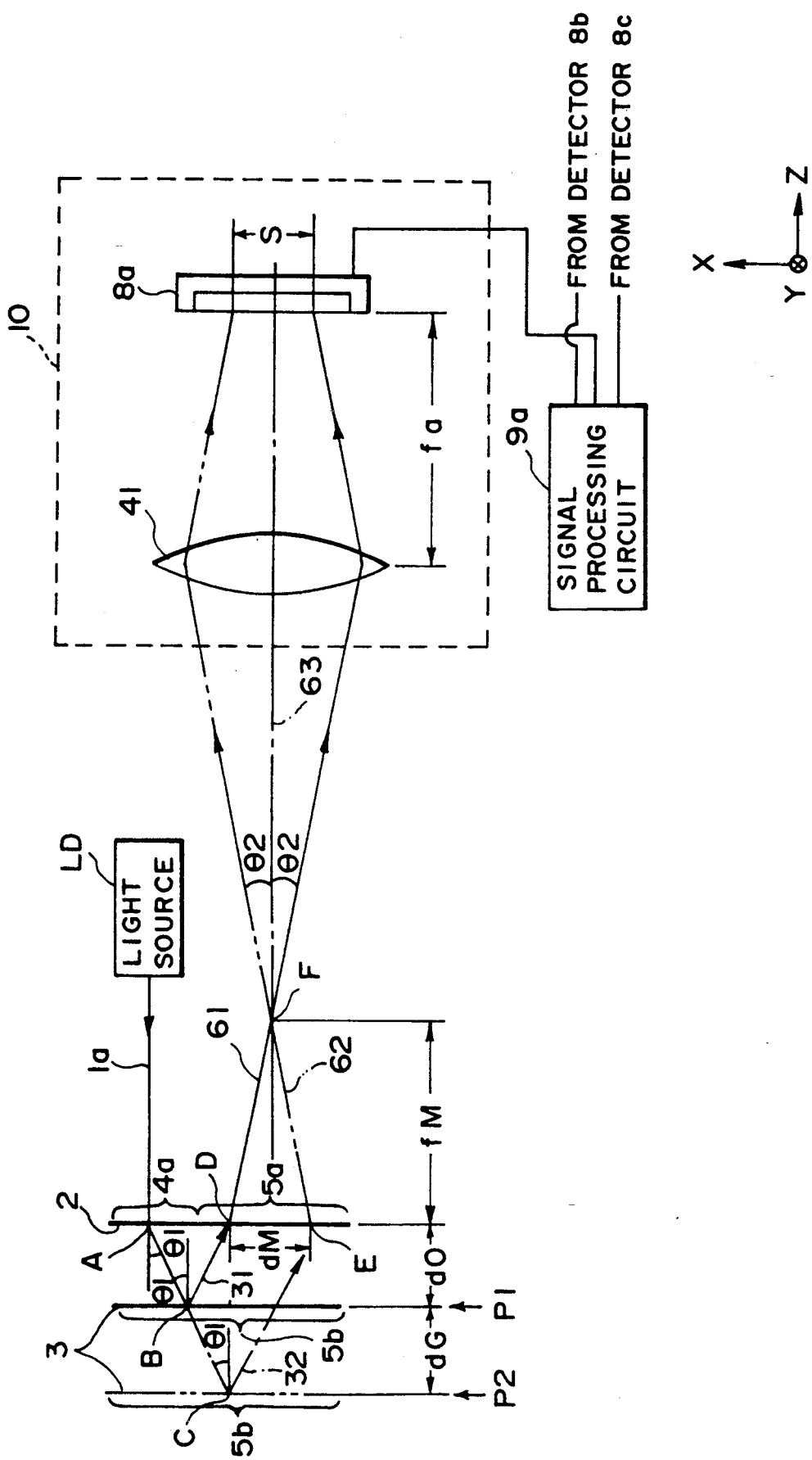
FIGS. 2 and 3 are schematic representations, respectively, showing optical arrangements of a measuring system and a correcting system of this embodiment.
Figure 3:
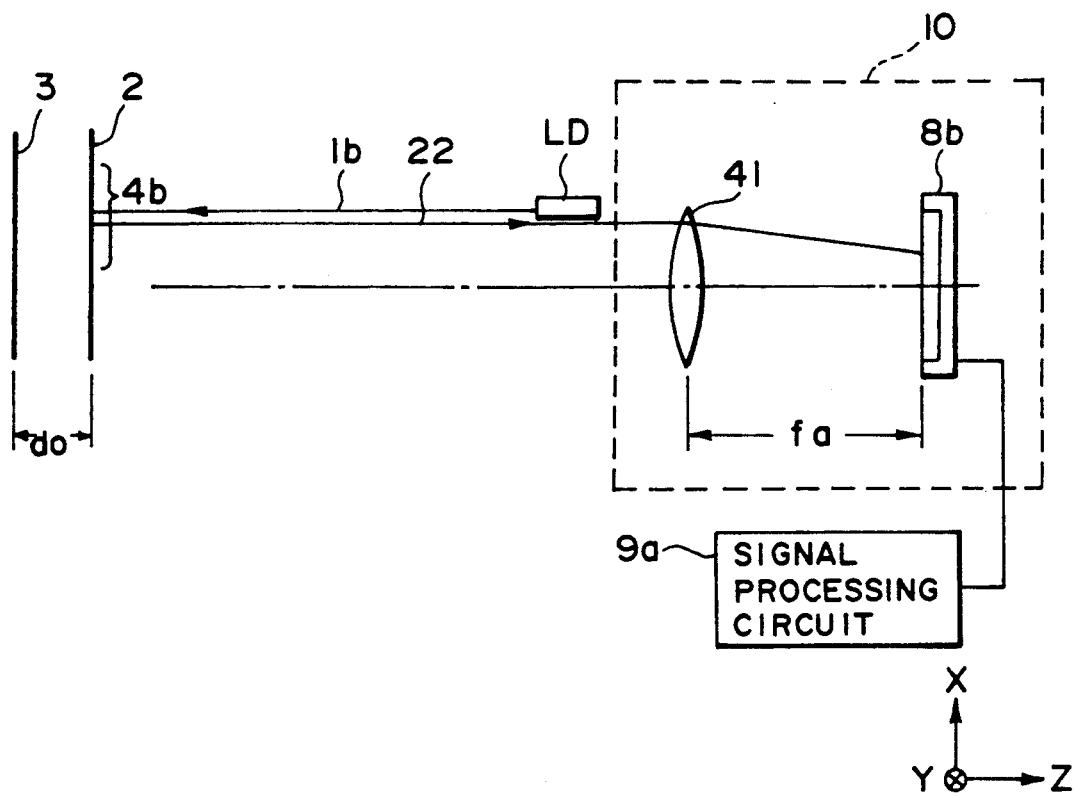

FIG. 1 is a perspective view, schematically showing a major portion of an embodiment of the present invention. FIGS. 2 and 3 illustrate optical principles of a measuring system and a correcting system of the measuring device of this embodiment.

In this embodiment, the measuring system is a system for mainly measuring the interval between first and second objects. The correcting system is a system for mainly correcting a measurement error where a change occurs in the relative position or relative attitude of an illumination system and a light receiving system or in the relative attitude of a wafer (second object), relative to a mask (first object).

In FIGS. 2 and 3, denoted at $1a$ and $1b$ are beams of light from a light source LD such as, for example, a He-Ne laser, a semiconductor laser or LED. The light $1a$ is used in the measuring system, and the light $1b$ is used in the correcting system. In this embodiment, a semiconductor laser is used as the light source LD.

Denoted at 2 is a first object which is, in this example, a mask held fixed. Denoted at 3 is a second object which is a wafer, in this example. As shown in FIG. 2, for example, the mask 2 and the wafer 3 are disposed opposed to each other with an interval $d_0$. Denoted at $4a$ and $5a$ are physical optic elements of the measuring system, provided for light reception and light emission, respectively, wherein these physical optic elements are formed in a portion of the mask 2 surface and are arrayed along the X-axis direction. Each of the physical optic elements $4a$ and $5a$ is provided by a diffraction grating or a zone plate, for example. The former has a size of about $30 \times 30$ (micron), and the latter has a size of about $30 \times 60$ (micron).

Similarly, denoted at $4b$ and $5b$ are physical optic elements of the correcting system, each comprising a diffraction grating. The former has a size of about $30 \times 90$ (micron), and the latter has a size of about $60 \times 90$ (micron).

The light emission side physical optic element $5a$ of the measuring system has a pattern adapted to provide an angle of deflection for the emanating light which angle changes in dependence upon the position of incidence of the light thereupon. The optical element $5a$ has a refracting power effective to converge a received parallel light at a position 1000 microns above it.

Denoted at 41 is a condensing lens system used in common for the measuring system and the correcting system. The lens system 41 has a focal length of $f_a$. In this example, $f_a$ is about 30 mm.

Denoted at $8a$ is a photodetector of the measuring system, and denoted at $8b$ and $8c$ are photodetectors of the correcting system. Each photodetector is disposed at the focal point position of the condenser lens 41, and each photodetector may comprise a line sensor having a function for detecting the position of incidence of a received light on its light receiving surface. Each of the photodetectors $8a$, $8b$ and $8c$ has its elements arrayed in a direction parallel to the X-axis direction. Signal processing circuit $9a$ serves to process the signals from the photodetectors $8a$, $8b$ and $8c$, to determine the positions of light beams incident on the surfaces of the photodetectors $8a$-$8c$, respectively. For each photodetector, a position sensitive detector (PSD) may be used in place of the line sensor.

Denoted generally at 10 is an optical pickup head which comprises the condensing lens system 41 and the light receiving means 8a–8c. As required, the pickup head may include the signal processing circuit 9a and the light source LD. The pickup head is movable relative to the mask 2 or the wafer 3, and it is made movable at least along the mask 2.

Next, the function of the measuring system shown in FIG. 2 will be explained. Here, it is assumed that in FIG. 2 the mask 2 and the wafer 3 are correctly disposed in parallel to each other.

In this embodiment, the light 1a (wavelength $\lambda = 830$ nm) from the semiconductor laser LD passes through a collimator lens (not shown) and impinges at a point A on the diffraction grating 4a of the mask 2, perpendicularly with respect to the X-Z plane. The diffraction grating 4a comprises straight grating elements having regular intervals. Diffracted light of a predetermined order or orders from the diffraction grating 4a, whose chief ray has been diffracted at an angle $\theta 1$ is obliquely inputted to a point B on the wafer 3 surface (a point C when the wafer 3 is at the position P2), and the inputted light is reflected thereby. Reflected light 31 is the reflected light when the wafer 3 is at the position P1 close to the mask, while reflected light 32 is the reflected light when the wafer 3 is at the position P2 which is displaced from the position P1 by a distance $d_G$. Broken lines in FIG. 2 depict the wafer 3 as it is at the position P2 and the optical path defined at that time.

The reflected light 31 (32) from the wafer 3 is incident on a point D (E) which is on the surface of an off-axis type Fresnel zone plate (hereinafter "FZP") 5a of the first object 2. The FZP 5a has such an optical function that the angle of emission of the emerging diffraction light, diffracted thereby, changes in accordance with the position of incidence of the light inputted thereto.

Diffraction light 61 (62) of a predetermined order or orders from the FZP 5a, diffracted at an angle $\theta 2$, is directed through the condensing lens system 41 to the surface of the light receiving means 8a. By detecting the position of the light 61 (62) incident on the surface of the photodetector 8a at that time, the interval between the mask 2 and the wafer 3 can be determined through calculation, which will be described later.

In this embodiment, each of the first and second physical optic elements (diffraction grating 4a and FZP 5a) provided on the mask 2 has a preset and known pitch and, therefore, the diffraction angle $\theta 1$ or $\theta 2$ of the diffraction light of a predetermined order or orders (e.g. positive and negative first orders), of the light inputted thereto, can be determined beforehand.

Next, the manner of detecting the interval between the mask 2 and the wafer 3 will be explained.

Assuming now that, as shown in FIG. 2, the distance to the mask 2 from the point F of intersection between the diffracted light 61 and the diffracted light 62 (which corresponds to the focal length of the light emission side physical optic element) is denoted by $f_M$, the following relations are given:

$$AD = 2d_O \tan 1 \quad (1)$$

$$AE = 2(d_O + d_G) \tan \theta 1$$

$$\therefore d_M = DE = AE - AD$$

$$= 2d_G \tan \theta 1$$

$$d_M = 2 \cdot f_M \cdot \tan \theta 2 \quad (2)$$

The quantity S of displacement of the light incident on the photodetector 8a surface as the wafer 3 position shifts from P1 to P2, is given by:

$$S = 2 \cdot f_a \cdot \tan \theta 2 \quad (3)$$

Thus, from equations (1), (2) and (3), it follows that:

$$S = 2 \cdot d_G \cdot (f_a/f_M) \cdot \tan \theta 1 \quad (4)$$

The quantity $\Delta S$ of displacement of the incident light upon the photodetector 8a surface with a unit change in the gap between the mask 2 and the wafer 3, namely, the sensitivity $\Delta S$, is given by:

$$\Delta S = S/d_G = (2 \cdot f_a/f_m) \cdot \tan \theta 1 \quad (5)$$
$$= (f_a/f_M) \cdot (d_M/d_G)$$

Actually, in this embodiment, for measurement, the light 1b (FIGS. 1 and 3) is projected to the physical optic element 4b of the mask by which the light is reflectively diffracted, such that reflectively diffracted light 22 emanates from the mask toward the photodetector 8b. The diffracted light 22 has a constant angle of emission independent of any change in the interval between the mask 2 and the wafer 3, and this light 22 is used as a reference light. Also, the position of the gravity center of the light 22 incident on the photodetector 8b is used as a reference. Namely, the spacing between this reference position and the gravity center position of the light 61 (62) on the photodetector 8a surface with respect to the X-axis direction, is measured. On the other hand, the spacing between the gravity center positions of the light 22 and the light 61 with respect to the X-axis direction, as established when the wafer 3 is at a position (e.g. position P1) corresponding to the correct interval $d_R$ ($d_R = d_0$) to be defined between the mask 2 and the wafer 3, is used as a reference spacing. The actually measured spacing mentioned above is compared with this reference spacing to determine the difference therebetween. While taking the difference as "S" in equation (4), the change $d_G$ in the mask-to-wafer gap, from the correct gap position P1 of the wafer is detected to determine the interval between the mask and the wafer. Here, the spacing between the gravity center positions of the two lights with respect to the X-axis direction as the correct gap $d_R$ is given, can be detected beforehand by using design values of the mark and the device, for example.

If in this embodiment, the condensing lens system 41 has a focal length $f_a = 30$ mm, $d_G = 50$ microns, $d_M = 30$ microns and $f_M = 1000$ microns, then, the sensitivity $\Delta S$ can be determined by equation (5), as follows:

$$\Delta S = (30000/1000) \cdot (30/50) = 18 \text{ (micron/micron)}$$

Thus, for a change in gap between the mask 2 and the wafer 3 through 1 micron, the light incident on the photodetector 8a surface displaces by 18 microns. Where a position sensitive detector having a position resolution of 0.3 micron is used as the photodetector 8a, in principle, it is possible to measure the interval between the mask 2 and the wafer 3 with a resolution of 0.02 micron or less.

In this embodiment, the condensing lens 41 is disposed just before the photodetectors 8a–8c of the measuring system. However, it is not always necessary to use such a condensing lens system. If it is not used, where the distance from the physical optic element (FZP) 5a of the mask 2 to the photodetector 8a is denoted by 1a, by setting $f_a = 1a$ in equations (3), (4) and (5), it is possible to determine the displacement S of the incident light and the sensitivity $\Delta S$.

Figure 6C:
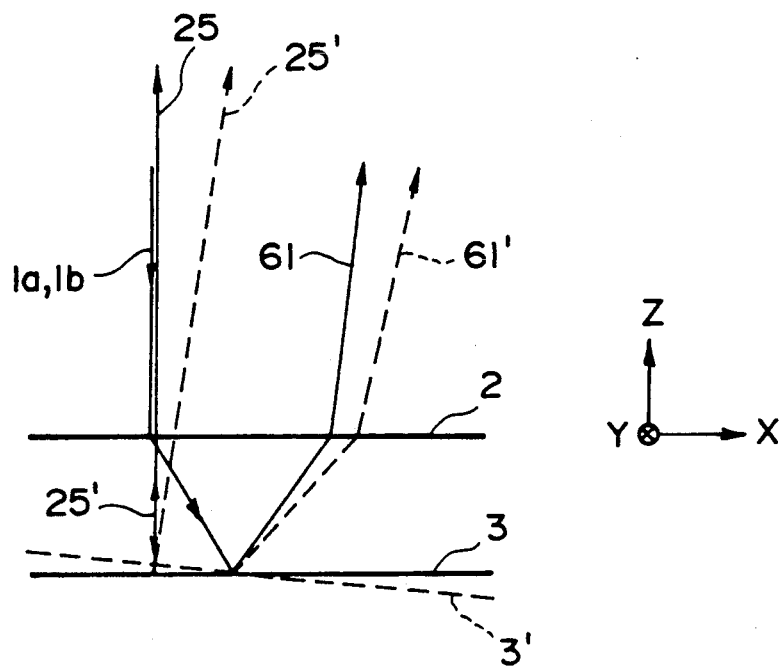
Figure 6D:
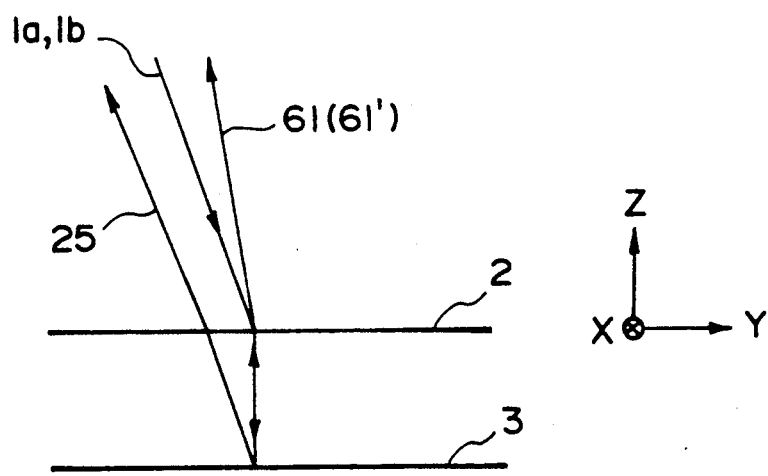

On the other hand, each of the physical optic elements 4b and 5b of the correcting system is provided by a diffraction grating comprising straight grating elements of regular intervals. As best seen in FIGS. 6B and 6D, the light 1b emanating from the semiconductor laser LD is obliquely inputted to the grating 4b of the mask 2, in the Z-Y plane, at a predetermined angle with respect to a normal to the mask 2 surface. Of the transmissively and reflectively diffracted light rays produced thereby, positive first order reflectively diffracted light 22 passes through the condensing lens system 41 and enters the photodetector 8b accommodated in the optical pickup head (not shown). The diffraction grating 4b has a pattern of straight grating whose grating lines extend in an oblique direction, intersecting with the X axis at an angle $\phi$, in an orthogonal coordinate system where the longitudinal direction of the interval measuring rectangular mark region lies on the X axis while the widthwise direction thereof lies on the Y axis.

Positive first order transmissively diffracted light 25′ diffracted by the diffraction grating 4b, impinges on the diffraction grating 5b of the wafer 3, and it is again reflected and diffracted thereby. Of the resultant rays, the light 25 having been diffracted, at the negative first order, by the diffraction grating 5b of the wafer 3 and having been transmitted, at the zero-th order, through the mask 2, is received by the second photodetector 8c accommodated in the optical pickup head (not shown). The physical optic element (diffraction grating) 5b comprises a straight grating similar to the diffraction grating 4b, and it has a pattern of grating lines which extend, in an orthogonal X′-Y′ coordinate system on the wafer 3 surface having X′ and Y′ axes parallel to the axes of the aforementioned X-Y coordinate system, in an oblique direction intersecting with the X′ axis, for example, at an angle of $\phi'$.

FIGS. 6A and 6B show optical paths 22 and 25 of the correcting system, in the X-Z section and the Y-Z section, respectively.

As shown in FIG. 6A, the direction for detecting the position of received light, of each of the photodetectors 8b and 8c for receiving the reference light 22 and 25, respectively, is parallel to the X axis and it coincides with that of the photodetector 8a which receives the measuring light 61 (62).

Next, the function of the reference light 22 and 25 of the correcting system will be explained, in greater detail.

First, referring to FIG. 3, the function of the reference light 22 will be explained. The light 1b impinges on the light entrance side physical optic element (diffraction grating) 4b of the mask 2. The diffraction grating 4b has such an optical characteristic that, independently of the position of incidence, it emanates a received parallel light at a constant deflection angle depending on the angle of incidence of the light.

Figure 4:
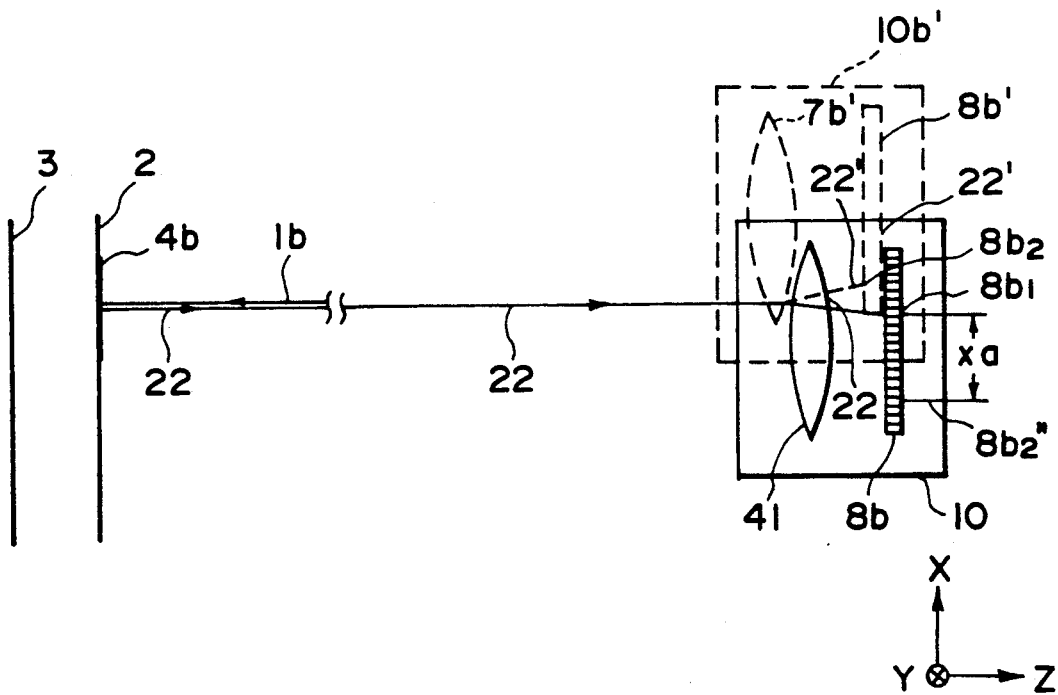
FIG. 4 is a schematic representation, for explaining a result of shift of the position of a pickup of the correcting system shown in FIG. 3.
Figure 5:
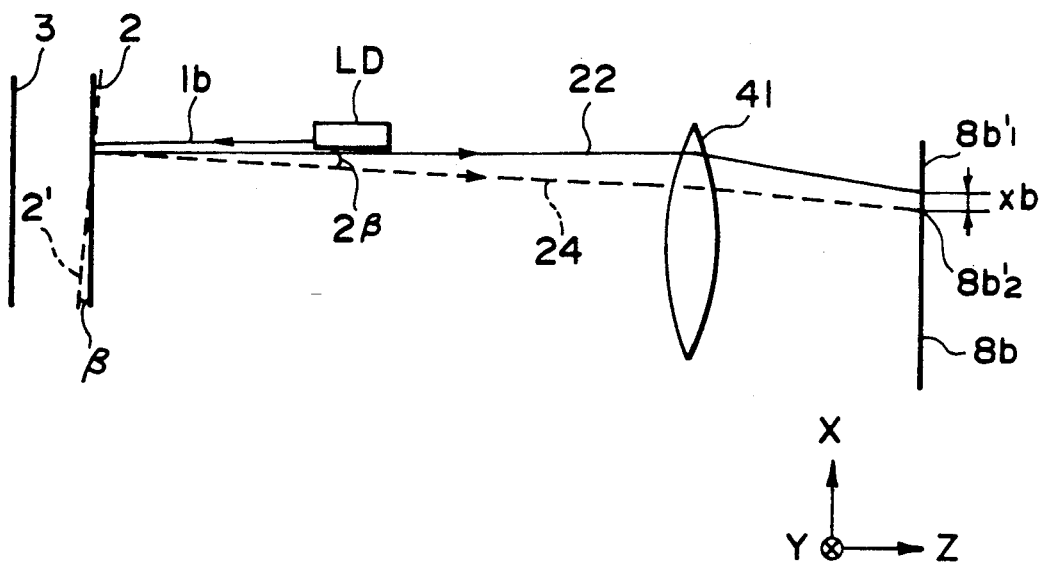
FIG. 5 is a schematic representation, for explaining a result of inclination of a mask in the correcting system shown in FIG. 3.
Figure 7:
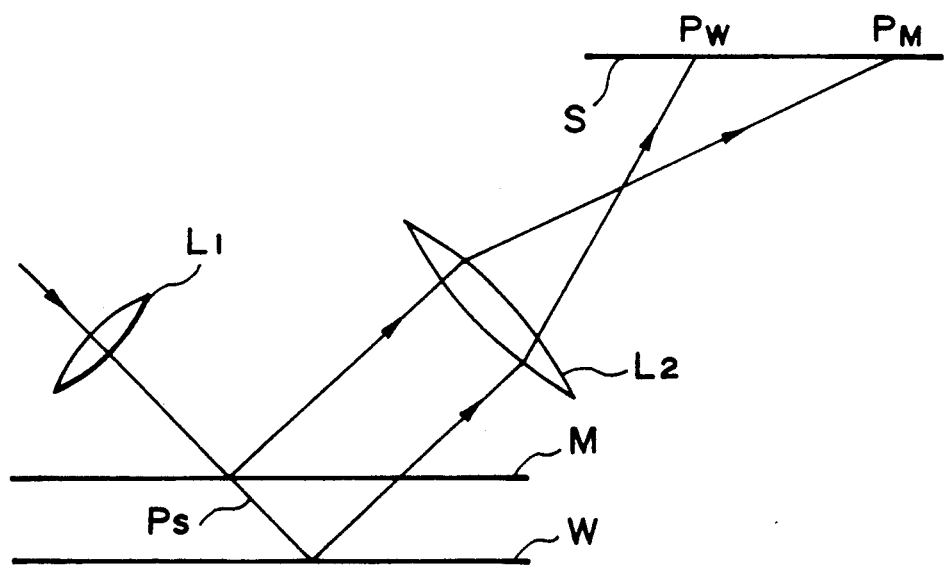
FIG. 7 illustrates a known example of an interval measuring device.

FIGS. 4 and 5 illustrate the principle of the correcting system shown in FIG. 3. Here, the light 1b from the semiconductor laser LD is perpendicularly inputted to the grating 4b of the mask 2. In this example, before impingement on the mask 2, the light 1b as well as the light 1a (FIG. 1) are portions of a single bundle of light supplied by the semiconductor laser LD. However, beams of light from separate light sources may be used. In that case, the light 1b may have the same wavelength as or a different wavelength from the light 1a used for the interval measurement. In this correcting system, first order diffraction light having been reflectively diffracted by the diffraction grating 4b is directed through the condensing lens 41 to the surface of the photodetector 8b.

In FIG. 4, broken lines depict the states of the light (22′) and the components of the optical pickup head 10 as the head 10 has shifted from its solid-line position, in the X-axis direction without any change in its attitude, and each component is denoted by the same reference numeral with dash. As seen from this drawing, if the optical pickup head 10 displaces translationally, the position of incidence of the reference light 22 upon the photodetector 8b changes from the point $8b_1$ to the point $8b_2$. Reference numeral $8b_2''$ denotes the position of the point $8b_2$ when the optical pickup head 10 is at its solid-line position. The amount of displacement of the light 22 resulting from such translational shift is denoted by $x_a$. In this case, the light 61 (62) impinging on the photodetector 8a accommodated in the same optical pickup head 10 and held in a fixed positional relationship with the photodetector 8b, also displaces by $x_a$ on the photodetector 8a surface. Thus, even if the optical pickup head 10 shifts translationally, the spacing between the light 61 (62) on the photodetector 8a and the light 22 on the photodetector 8b with respect to the X-axis direction, does not change.

In FIG. 5, broken lines 2′ and 24 depict the mask and the reference light as the mask 2 tilts by an angle $\beta$ from its initial state, depicted by a solid line, because of the mask replacement or the like. As seen from this drawing, if the mask tilts relative to the optical pickup head 10, the position of incidence of the reference light upon the photodetector 8b shifts from the point $8b_1'$ to the point $8b_2'$. The quantity of displacement of the light due to such inclination of the mask is denoted by $x_b$. In this case, provided that the angle $\beta$ is within a sufficiently small range and that the length of the light path from the mask 2′ to the condensing lens 41 is substantially equal to the path length of the light 24, the light 61 impinging on the photodetector 8a displaces similarly by $x_b$. Thus, also even if the mask is inclined, the spacing between the light 61 (62) on the photodetector 8a and the light 22 on the photodetector 8b with respect to the X-axis direction, does not change.

Further, if the mask displaces in the X-axis direction or if the optical pickup head tilts, similarly, the spacing between two lights in the X-axis direction is unchangeable.

Therefore, by detecting the spacing between the light 61 (62) and the light 22 in the X-axis direction and by substituting the detected spacing into equation (4), it is possible to measure the interval between the mask and the wafer without adverse effects of changes described above.

If plural exposure processes include a step of mask replacement or movement of an optical pickup head, even if the mask and the wafer are held at the correct interval, it is not possible to measure the interval accurately only by determining the interval on the basis of the position of incidence of the light upon the photodetector 8a of the measuring system. As compared therewith, by using the reference light 22 representing the "interval" measurement reference point position as in the present embodiment, it becomes possible to attain high-precision interval measurement.

Similarly, even if not a large change in the relative angle (attitude) occurs between the optical pickup head 10 and the mask 2 surface during plural exposure processes, not only the change in the relative position of them, by using the position of incidence of the reference light 22 on the photodetector 8b as a reference point, as in the present embodiment, it is possible to reduce or cancel the error in the interval measurement based on the position of incidence of the measuring light 61 (62) upon the photodetector 8a, resulting from the angular change, to thereby attain enhanced precision as compared with that as attainable conventionally.

As described hereinbefore, use of the reference light 22 together with the detection of the spacing between the measuring light 61 (62) and the reference light 22 in the X-axis direction, prevents an error in the interval measurement attributable to any displacement of the optical pickup head 10 which accommodates therein the light source LD, the photodetectors 8a–8c and the like or to any change in the relative position or angle (attitude) between the head and the mask resulting from mask replacement or the like.

As an example, adjustment may be made beforehand to ensure that the center of a photodetector for receiving the measuring light coincides with the center of a photodetector for receiving the reference light with respect to a predetermined direction. The position of incidence of the reference light upon the corresponding photodetector may be used as a reference point, and the spacing with respect to the predetermined direction between the reference point and the position of incidence of the measuring light upon the corresponding photodetector as measured in respect to the same detecting direction (e.g. X-direction) as the reference light, may be detected. Then, it is possible to measure the interval without being affected by any relative change between the head and the mask surface.

After measurement of the interval with the device of the present embodiment, a wafer chuck (not shown) for holding the wafer is moved upwardly or downwardly so that a correct interval is defined between the mask and the wafer.

The reference light 25 is used to correct or compensate an error in the interval measurement caused by any relative inclination of the wafer 3 surface, relative to the mask 2 surface. The light transmissively diffracted at the first order, within the Y-Z plane, by the diffraction grating (physical optic element) 4b of the mask is perpendicularly incident on the wafer 3 surface and, by the diffraction grating (physical optic element) 5b, it is reflectively diffracted at the negative first order by the diffraction grating 5b within the Y-Z plane, whereby the reference light 25 is provided. The light 25 is transmitted through the mask 2 at the zero-th order and impinges on the photodetector 8c in the optical pickup head 10. The circuit 9a operates to detect the position of incidence of the light on the photodetector 8c, with respect to the same direction (X-axis direction) as the measuring light 61 (62).

It is not always necessary that the reference light 25 is perpendicularly incident on the wafer surface. For example, if the photodetector 8c has a resolution $\Delta S$ for detection of the gravity center position of the light intensity and the measurement range for variation of the interval between the mask and the wafer (with respect to a reference set value) is denoted by $\Delta P$, accurate measurement is attainable by satisfying the following condition:

$$2\Delta P \tan\theta \leq \alpha \cdot \Delta S$$

wherein $\theta$ is the angle of incidence upon the wafer surface in the X-Z plane, and $\alpha$ is a constant that satisfies $0 < \alpha < 1$ (e.g. $\alpha = 0.1$). In this case, the light is incident on the wafer surface substantially perpendicularly.

Namely, if the angle $\theta$ satisfies the above relation, the position of incidence of the reference light 25 upon the photodetector 8c can be regarded as substantially constant even if the interval between the mask and the wafer changes. Accordingly, it is possible to detect and correct any inclination of the wafer relative to the mask. The correction may be made by tilting the wafer chuck (not shown) for holding the wafer. After this correction, the interval detection and the interval adjustment described hereinbefore are executed.

The light source LD is accommodated in the optical pickup head 10. When the mask 2 surface is taken as a reference surface, there is a possibility that, due to displacement of the head 10 during plural printing and exposure processes, the angle of projection of the light 1a (1b) from the light source SL to the mask 2 surface (the angle as defined between the chief ray vector and a normal to the mask 2 surface) changes. This case will be explained below.

Under these conditions, generally, the spacing between the first reference light 22 and the second reference light 25 on the sensor with respect to the X-axis direction does not correspond to the reference interval, i.e., the interval between the mask and the wafer as they are held parallel to each other. This is because, as seen from the motion of the light 25 as depicted by a broken line in FIG. 6C, there is additional displacement of the gravity center position of each of the lights 22 and 25 on the photodetectors 8b and 8c, in the X-axis direction, resulting from the inclination of the wafer surface relative to the mask surface. Here, FIG. 6D corresponds to a side view of that shown in FIG. 6C. As illustrated, if the angle of projection of the light 1a (1b) as well as the inclination of the wafer surface, with respect to the mask surface, are deviated from respective design values (idealistic values), the spacing between the gravity center positions of the first and second reference lights 22 and 25 on the photodetectors 8b and 8c, with respect to the X-axis direction, does not correspond to the reference spacing.

In consideration of the above inconvenience, the sequence of measurement may be such that, for example, a wafer stage is moved to move the wafer chuck so that the distance between the gravity center positions of the first and second reference lights 22 and 25 on the photodetectors 8b and 8c with respect to the X-axis direction becomes equal to a reference value and, then, the inclination of the wafer 3 surface is adjusted so that it becomes parallel to the mask 2 surface.

The above-described reference value may be determined beforehand by light ray tracing simulation during design of each mark, for example.

This is based on the fact that, where the shape of the mark pattern is determined so that the first and second reference lights are influenced only by diffraction in the Z-Y plane at the mask and wafer surfaces, in the optical system such as shown in FIG. 6 the distance between the gravity centers of the first and second reference lights on the sensor surface is determined dominantly by the inclination of the wafer surface relative to the mask surface.

Subsequently, the interval between the mask and the wafer may be controlled so that the spacing between the gravity center positions of the first reference light 22 and the signal light 61 upon the photodetectors 8b and 8a becomes equal to the reference spacing as predetermined.

At this time, the spacing between the gravity center positions of the first and second reference lights upon the photodetectors 8b and 8c with respect to the X-axis direction, is held at the reference value having been set beforehand.

In the foregoing embodiments, an array of three photodetectors are used to receive three reflected beams from the mask and the wafer, independently of each other. However, a single photodetector such as an image pickup device having light receiving elements arrayed two-dimensionally, may be used to receive the three reflected beams to detect their incident positions, respectively.

Also, while in the foregoing embodiments the three reflected beams are directed to the photodetecting means by using a single condensing lens system, three separate condensing lens systems may be used to direct the three reflected beams to the photoelectric converting means, separately from each other.

Further, while in the foregoing embodiments each of the diffraction patterns of the mask and the wafer for the reference light comprises a diffraction pattern having no optical power, the structure of the diffraction pattern is not limited thereto.

Further, while in the foregoing embodiments the light for interval measurement is inputted again to the mask from the diffraction pattern of the wafer, the wafer may be patterned so that no diffraction pattern is formed at the location at which the measuring light impinges.

The device of the present invention is particularly suitably usable in a proximity type exposure apparatus. However, the invention is not limited to the application to this type of exposure apparatus.

While the invention has been described with reference to the structures disclosed herein, it is not confined to the details set forth and this application is intended to cover such modifications or changes as may come within the purposes of the improvements or the scope of the following claims.

What is claimed is:

1. A device for detecting relative positional deviation between a mask and a wafer, wherein the mask has a first grating pattern and a zone plate pattern and the wafer has a second grating pattern, said device comprising:
    directing means for directing a radiation beam to the first gating pattern of the mask, such that the first grating pattern produces a first transmitted beam which is then inputted to the wafer substantially perpendicularly and a second transmitted beam which is obliquely inputted to the wafer and such that the first grating pattern also produces a first reflected beam; and
    detecting means for detecting (i) the first reflected beam and also for detecting (ii) a second reflected beam resulting from reflective diffraction of the first transmitted beam by the second grating pattern of the wafer, the second reflected beam being displaceable with any inclination of a surface of the wafer and (iii) a third reflected beam resulting from reflection of the second transmitted beam by the wafer surface and from diffraction of the same by the zone plate pattern of the mask, the third reflected beam being displaceable with any inclination of the wafer surface and any change in an interval between the mask and the wafer.

2. A device according to claim 1, wherein said detecting means includes photoelectric converting means for detecting positions of the first, second and third reflected beams incident thereupon.

3. A device according to claim 2, wherein said photoelectric converting means includes first, second and third photodetectors for receiving the first, second and third reflected beams, independently of each other.

4. A device according to claim 2, wherein said detecting means includes a single condensing lens system for directing the first, second and third reflected beams to said photoelectric converting means.

5. A device according to claim 2 or 3, wherein said detecting means includes first, second and third condensing lens systems for directing the first, second and third reflected beams to said photoelectric converting means independently of each other.

6. A device according to claim 3, wherein each of said photodetectors comprises arrayed light receiving elements.

7. A device according to claim 3, wherein each of said photodetectors comprises a position sensitive detector.

8. A device according to claim 1 or 2, wherein said directing means directs the radiation beam so that it is obliquely incident upon said first grating pattern.

9. A device according to claim 1 or 2, wherein said first grating pattern is formed by grating elements of regular intervals, having substantially no power.

10. A device according to claim 1 or 2, wherein said second grating pattern is formed by grating elements of regular intervals, having substantially no power.

11. A device according to claim 1, wherein said first grating pattern comprises a first straight grating and a second straight grating juxtaposed with each other in an array, and wherein said directing means directs the radiation beam to said first diffraction pattern such that the first and second reflected beams are produced through said first straight grating while the third reflected beam is produced through said second straight grating.

12. A device according to claim 11, wherein said detecting means is responsive to displacement of each of the first, second and third reflected beams in a predetermined direction, and wherein each of said first and second straight gratings has grating lines extending obliquely to said predetermined direction.

13. A device according to claim 1 or 2, wherein said directing means includes a light emitting diode for producing the radiation beam.

14. A device according to claim 1 or 2, wherein said directing means includes a semiconductor laser for producing the radiation beam.

15. A device according to claim 1 or 2, wherein said directing means directs, as the radiation beam, a substantially parallel light beam to said first grating pattern.

16. A device according to claim 1, wherein said directing means and said detecting means are mounted on an optical detection head.

17. A device according to claim 16, wherein said detection head is movable along the surface of the mask.

18. A device according to claim 2, further comprising correction means, wherein, on the basis of the position of incidence of the second reflected beam upon said photoelectric converting means, any inclination of the wafer with respect to a predetermined plane is corrected with said correction means, and wherein, on the basis of the position of incidence of the first reflected beam as well as the position of incidence of the third reflected beam, both upon said photoelectric converting means, the interval is determined.

19. A device according to claim 1, wherein said device is used for an exposure apparatus.

20. A device for detecting a relative positional deviation between a mask and a wafer, wherein the mask has first and second grating patterns and a zone plate pattern disposed with a predetermined orientation together with the second grating pattern, wherein the wafer has a third grating pattern, and wherein each of the first to third grating patterns is provided by grating elements of regular intervals, said device comprising:
   directing means for directing a radiation beam to the first and second grating patterns of the mask so that the beam is obliquely inputted to the mask with respect to a plane substantially orthogonal to a predetermined direction, such that the first grating pattern produces a first transmissively diffracted beam which is then inputted to the wafer substantially perpendicularly and also produces a first reflected beam while the second grating pattern produces a second transmissively diffracted beam which is obliquely inputted to the wafer; and
   photodetecting means having a light receiving surface, for detecting (i) a position of incidence of the first reflected beam upon said light receiving surface, (ii) a position of incidence upon said light receiving surface of a second reflected beam resulting from reflective diffraction of the first transmissively diffracted beam by the third grating pattern of the wafer, the second reflected beam being displaceable in said predetermined direction with any inclination of a surface of the wafer, and (iii) a position of incidence upon said light receiving surface of a third reflection beam resulting from reflection of the second transmissively diffracted beam by the wafer surface and from diffraction of the same by the zone plate pattern of the mask, the third reflected beam being displaceable in said predetermined direction with any inclination of the wafer surface and with any change in an interval between the mask and the wafer.

21. A device according to claim 20, wherein said photodetecting means includes first, second and third photodetectors each having a light receiving portion with light receiving elements arrayed in said predetermined direction, and wherein said first photodetector receives the first reflected beam, said second photodetector receives the second reflected beam and said third photodetector receives the third reflected beam.

22. A device according to claim 20 or 21, further comprising correction means wherein, on the basis of the position of incidence of the second reflected beam upon said light receiving surface, any inclination of the wafer with respect to a predetermined plane is corrected with said correction means, and wherein, on the basis of the position of incidence of the first reflected beam as well as the position of incidence of the third reflected beam, upon said light receiving surface, the interval is determined.

23. A device according to claim 20, wherein said device is used for an exposure apparatus.

24. A device for detecting a relative positional deviation between a mask and a wafer, said device comprising:
   directing means for directing a radiation beam to the mask, such that the mask produces a first transmitted beam which is inputted to the wafer substantially perpendicularly and a second transmitted beam which is obliquely inputted to the wafer and that the mask also produces a first reflected beam; and
   detecting means for detecting (i) the first reflected beam and also for detecting (ii) a second reflected beam resulting from reflection of the first transmitted beam by the wafer and (iii) a third reflected beam resulting from reflection of the second transmitted beam by the wafer and from diffraction of the same by a zone plate of the mask, the third reflected beam being displaceable with any inclination of the wafer and with any change in an interval between the mask and the wafer.

25. A device according to claim 24, wherein said device is used for an exposure apparatus.

26. A semiconductor device manufacturing method comprising the steps of:
   preparing a mask having a first grating pattern and a zone plate pattern and a wafer having a second grating pattern;
   directing a radiation beam to the first grating pattern of the mask, such that the first grating pattern produces a first transmitted beam which is then inputted to the wafer substantially perpendicularly and a second transmitted beam which is obliquely inputted to the wafer and such that the first grating pattern also produces a first reflected beam;
   detecting (i) the first reflected beam and also detecting (ii) a second reflected beam resulting from reflective diffraction of the first transmitted beam by the second grating pattern of the wafer, the second reflected beam being displaceable with any inclination of a surface of the wafer and (iii) a third reflected beam resulting from reflection of the second transmitted beam by the wafer surface and from diffraction of the same by the zone plate pattern of the mask, the third reflected beam being displaceable with any inclination of the wafer surface and any change in an interval between the mask and the wafer.

27. A semiconductor device manufactured by a method comprising the steps of:
   preparing a mask having a first grating pattern and a zone plate pattern and a wafer having a second grating pattern;
   directing a radiation beam to the first grating pattern of the mask, such that the first grating pattern produces a first transmitted beam which is then inputted to the wafer substantially perpendicularly and a second transmitted beam which is obliquely inputted to the wafer and such that the first grating pattern also produces a first reflected beam;
   detecting (i) the first reflected beam and also detecting (ii) a second reflected beam resulting from reflective diffraction of the first transmitted beam by the second grating pattern of the wafer, the second reflected beam being displaceable with any inclination of a surface of the wafer and (iii) a third transmitted beam resulting from reflection of the second transmitted beam by the wafer surface and from diffraction of the same by the zone plate pattern of the mask, the third reflected beam being displaceable with any inclination of the wafer surface and any change in an interval between the mask and the wafer.

28. A semiconductor device manufacturing method comprising the steps of:

preparing a mask and a wafer;

directing a radiation beam to the mask, such that the mask produces a first transmitted beam which is inputted to the wafer substantially perpendicularly and a second transmitted beam which is obliquely inputted to the wafer and that the mask also produces a first reflected beam;

detecting (i) the first reflected beam and also detecting (ii) a second reflected beam resulting from reflection of the first transmitted beam by the wafer and (iii) a third reflected beam resulting from reflection of the second transmitted beam by the wafer and from diffraction of the same by a zone plate of the mask, the third reflected beam being displaceable with any inclination of the wafer and with any change in an interval between the mask and the wafer.

29. A semiconductor device manufactured by a method comprising the steps of:

preparing a mask and a wafer;

directing a radiation beam to the mask, such that the mask produces a first transmitted beam which is inputted to the wafer substantially perpendicularly and a second transmitted beam which is obliquely inputted to the wafer and that the mask also produces a first reflected beam;

detecting (i) the first reflected beam and also detecting (ii) a second reflected beam resulting from reflection of the first transmitted beam by the wafer and (iii) a third reflected beam resulting from reflection of the second transmitted beam by the wafer and from diffraction of the same by a zone plate of the mask, the third reflected beam being displaceable with any inclination of the wafer and with any change in an interval between the mask and the wafer.

* * * * *

UNITED STATES PATENT AND TRADEMARK OFFICE
CERTIFICATE OF CORRECTION

PATENT NO. : 5,196,711          Page 1 of 2
DATED      : March 23, 1993
INVENTOR(S) : Masakazu Matsugu, et al.

It is certified that error appears in the above-indentified patent and that said Letters Patent is hereby corrected as shown below:

ON THE COVER PAGE

IN THE ABSTRACT

Line 17, "third" should read --second--;
Line 21, "mask" should read --mask,--; and
Line 22, "and" should read --the third reflected beam--.

IN THE DISCLOSURE

COLUMN 1

Line 67, "mask and" should read --mask, the third reflected beam--.

COLUMN 2

Line 1, "mask, the third reflected beam the" should read --mask and the--;
Line 29, "beam," should read --beam--;
Line 55, "wafer, the third reflected beam" should read --wafer and--; and
Line 56, "mask and" should read --mask, the third reflected beam--.

UNITED STATES PATENT AND TRADEMARK OFFICE
CERTIFICATE OF CORRECTION

PATENT NO. : 5,196,711
DATED : March 23, 1993
INVENTOR(S) : Masakazu Matsugu, et al.

It is certified that error appears in the above-indentified patent and that said Letters Patent is hereby corrected as shown below:

COLUMN 12

Line 53, "claim-" should read --claim--.

COLUMN 13

Line 48, "reflection" should read --reflected--.

Signed and Sealed this

Twenty-second Day of February, 1994

Attest:

BRUCE LEHMAN

*Attesting Officer*   *Commissioner of Patents and Trademarks*